US008716800B2

(12) United States Patent
Zhu et al.

(10) Patent No.: US 8,716,800 B2
(45) Date of Patent: May 6, 2014

(54) SEMICONDUCTOR STRUCTURE AND METHOD FOR MANUFACTURING THE SAME (75) Inventors: Huilong Zhu, Poughkeepsie, NY (US); Haizhou Yin, Poughkeepsie, NY (US); Zhijong Luo, Poughkeepsie, NY (US); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/258,642

(22) PCT Filed: Mar. 4, 2011

(86) PCT No.: PCT/CN2011/071534
§ 371 (c)(1),
(2), (4) Date: Sep. 22, 2011

(87) PCT Pub. No.: WO2012/088797
PCT Pub. Date: Jul. 5, 2012

(65) Prior Publication Data
US 2012/0168863 A1   Jul. 5, 2012

(30) Foreign Application Priority Data
Dec. 31, 2010 (CN) .......................... 2010 1 0617456

(51) Int. Cl.
*H01L 29/786* (2006.01)
(52) U.S. Cl.
USPC .... 257/349; 257/347; 257/354; 257/E21.702; 257/E21.703; 257/E21.704
(58) Field of Classification Search
USPC ...................... 257/327, 347, E21.7, E21.702, 257/E21.703, E21.704
See application file for complete search history.

(56) References Cited

U.S. PATENT DOCUMENTS 6,838,733 B2 * 1/2005 Takehiro ........................ 257/347
8,106,458 B2 * 1/2012 Cai et al. ........................ 257/351
(Continued)

FOREIGN PATENT DOCUMENTS

CN           1523649 A        8/2004

OTHER PUBLICATIONS

International Search Report for PCT/CN2011/071534, issued on Oct. 13, 2011.

(Continued)

*Primary Examiner* — Eduardo A Rodela
(74) *Attorney, Agent, or Firm* — Osha Liang LLP (57) ABSTRACT Semiconductor structure and methods for manufacturing the same are disclosed. In one embodiment, the semiconductor device is formed on an SOI substrate comprising an SOI layer, a buried insulating layer, a buried semiconductor layer and a semiconductor substrate from top to bottom, and comprises: source/drain regions formed in the SOI layer; a gate formed on the SOI layer, wherein the source/drain regions are located at both sides of the gate; a back gate region formed by a portion of the buried semiconductor layer which is subjected to resistance reduction; and a first isolation structure and a second isolation structure which are located at both sides of the source/drain regions and extend into the SOI substrate; wherein the first isolation structure and the second isolation structure laterally adjoin the SOI layer at a first side surface and a second side surface respectively; the first isolation structure laterally adjoins the buried semiconductor layer at a third side surface; and the third side surface is located between the first side surface and the second side surface.

8 Claims, 7 Drawing Sheets

(56) References Cited

U.S. PATENT DOCUMENTS

| | | |
|---|---|---|
| 8,227,864 B2 * | 7/2012 | Kikuchi ................. 257/347 |
| 2002/0175373 A1 * | 11/2002 | Utsunomiya et al. ......... 257/347 |
| 2003/0209761 A1 * | 11/2003 | Yagishita et al. ............ 257/347 |
| 2004/0121549 A1 * | 6/2004 | Dokumaci et al. ........... 438/283 |
| 2005/0253197 A1 * | 11/2005 | Tokushige ................. 257/347 |
| 2007/0075317 A1 * | 4/2007 | Kato et al. ................. 257/74 |
| 2007/0210418 A1 * | 9/2007 | Nakajima ................. 257/547 |
| 2009/0242953 A1 * | 10/2009 | Booth et al. ............... 257/301 |
| 2010/0258869 A1 * | 10/2010 | Morita et al. .............. 257/347 |
| 2010/0271864 A1 | 10/2010 | Itoh et al. |

OTHER PUBLICATIONS

Written Opinion of ISR for PCT/CN2011/071534, issued on Oct. 13, 2011.

English Abstract of CN1523649.

Khater, et al., FDSOI CMOS with Dielectrically-Isolated Back Gates and 30nm Lg High-k/Metal Gate, 2010 Symposium on VLSI Technology Digest of Technical Papers, pp. 43-44.

* cited by examiner

SEMICONDUCTOR STRUCTURE AND METHOD FOR MANUFACTURING THE SAME

CROSS-REFERENCE TO RELATED APPLICATIONS

This application is a National Phase application of PCT Application No. PCT/CN2011/071534, filed on Mar. 4, 2011, entitled "SEMICONDUCTOR STRUCTURE AND METHOD FOR MANUFACTURING THE SAME", which claims priority to Chinese Application No. 201010617456.4, filed on Dec. 31, 2010. Both the PCT Application and Chinese Application are incorporated herein by reference in their entirety.

TECHNICAL FIELD

The present disclosure relates to semiconductor technology, and more particularly, to semiconductor structures and methods for manufacturing the same.

BACKGROUND

In order to improve efficiency of Very Large Scale Integration (VLSI) and reduce manufacturing cost, a gate pitch of a complementary metal oxide semiconductor (CMOS) transistor becomes smaller increasingly. However, reduction of the gate pitch causes short channel effects and lower performance of a device.

In Semiconductor On Insulator (SOI) technology, devices and circuits are formed on a semiconductor film on an insulating layer. Due to the existence of the insulating layer, complete dielectric isolation is realized between the devices and bulk silicon. Therefore, the latch-up effect in bulk silicon CMOS can be intrinsically avoided in an SOI-CMOS integrated circuit. In addition, the short channel effects of Fully Depleted SOI (FD-SOI) device are relatively small. A shallow junction is naturally formed and a leakage current is relatively small. Therefore, FD-SOI MOSFETs having an ultrathin body and double gates attract much attention. By providing a buried semiconductor layer under an ultrathin buried oxide layer (BOX) in an ultrathin SOI MOSFET and forming doped back gates for both an NFET and a PFET in the buried semiconductor layer, the threshold voltage can be adjusted effectively and the short channel effects can be suppressed. However, it is difficult to provide effective insulation between the devices and the back gates with such configuration. Consequently, it is difficult to control the back gate.

Figure 1:
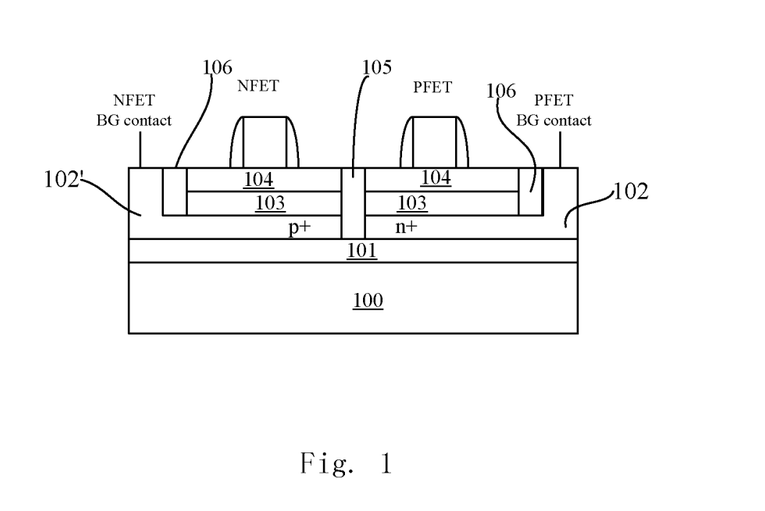
FIG. 1 is a cross-sectional view for illustrating a structure of a semiconductor device having a back gate in the prior art.

M. Khater et al. proposes a structure which combines STIs having double depths with double BOX substrates in "FDSOI CMOS with Dielectrically-Isolated Back gates and 30 nm Lg High-k/Metal Gate", 2010 Symposium on VLSI Technology Digest of Technical Papers, 43-44. As shown in FIG. 1, there is a first buried layer 101 on a substrate 100 and a buried semiconductor layer on the first buried layer 101. The buried semiconductor layer is separated by a first STI 105 and forms a p+ doped back gate 102' and an n+ doped back gate 102. There is a second buried layer 103 on the buried semiconductor layer, an SOI layer 104 on the second buried layer 103, and a gate stack on the SOI layer 104. The back gate 102 and the back gate 102' are separated from the SOI layer 104 by a second isolation structure 106. Such configuration can effectively control the back gate of the NFET or the PFET, without increasing the leakage current. However, if such configuration is used, erosion of the STI structure in the semiconductor manufacture process possibly occurs such that the STI structure is eroded to the level where the buried semiconductor is located when contact plugs are formed, which may cause shorts between source/drain contacts and the buried semiconductor layer.

SUMMARY

The object of the present disclosure is to provide a semiconductor structure and a method for manufacturing the same, to overcome the foregoing problems in the prior art, and more particularly, to avoid shorts between source/drain contacts and a buried semiconductor layer below a buried oxide layer when contact plugs are formed.

According to one aspect of the present disclosure, there is provided a semiconductor structure formed on an SOI substrate comprising an SOI layer, a buried insulating layer, a buried semiconductor layer and a semiconductor substrate from top to bottom, said semiconductor structure comprising: source/drain regions formed in the SOI layer; a gate formed on the SOI layer, wherein the source/drain regions are located at both sides of the gate; a back gate region formed by a portion of the buried semiconductor layer which is subjected to resistance reduction; and a first isolation structure and a second isolation structure which are located at both sides of the source/drain regions and extend into the SOI substrate; wherein the first isolation structure and the second isolation structure laterally adjoin the SOI layer at a first side surface and a second side surface, respectively; the first isolation structure laterally adjoins the buried semiconductor layer at a third side surface; and the third side surface is located between the first side surface and the second side surface.

In an example, the buried semiconductor layer according to the embodiments of the present disclosure is a buried oxide layer.

According to another aspect of the present disclosure, there is provided a method for manufacturing a semiconductor structure, comprising: providing an SOI substrate having an SOI layer, a buried insulating layer, a buried semiconductor layer and a semiconductor substrate from top to bottom; etching the SOI substrate to form a first preliminary trench and a second preliminary trench; isotropically etching or laterally etching the SOI substrate in both the first preliminary trench and the second preliminary trench so that the first preliminary trench and the second preliminary trench are formed as a first isolation trench and a second isolation trench, wherein the first isolation trench and the second isolation trench laterally adjoin the SOI layer at a first side surface and a second side surface respectively, the first isolation trench also laterally adjoins the buried semiconductor layer at a third side surface which is located between the first side surface and the second side surface; filling the first isolation trench and the second isolation trench with a dielectric material to form a first isolation structure and a second isolation structure; forming a back gate region by resistance reduction of the buried semiconductor layer; forming a gate on the SOI layer between the first isolation structure and the second isolation structure; and forming source/drain regions in the SOI layer between the first isolation structure and the second isolation structure.

The buried insulating layer may be buried oxide layer according to the embodiments of the present disclosure.

In the method of the embodiment of the present disclosure, the first isolation trench and the second isolation trench laterally adjoin the SOI layer at a first side surface and a second side surface, respectively, the first isolation trench also laterally adjoins the buried semiconductor layer at a third side surface, and the third side surface is located between the first side surface and the second side surface.

In the semiconductor structure and the method for manufacturing the same according to the embodiments of the present disclosure, since the third side surface is located between the first side surface and the second side surface, the isolation structure according to the embodiments of the present disclosure is formed in the SOI layer and extends laterally into the buried semiconductor layer so that both sides of the buried semiconductor layer below the SOI layer are occupied by a dielectric layer of the isolation structure, which directly increases the bottom of the isolation structure.

In a conventional semiconductor manufacture process, the STI structure is eroded in some processes such as gate etching and source/drain formation, after forming the STI structure. Once the STI structure is eroded to reach the buried semiconductor layer, the shorts between the source/drain regions of the back gate region may easily occur in case of photolithography misalignment while forming contact holes. In the semiconductor structure and the method for manufacturing the same according to the embodiments of the present disclosure, the isolation structure embedded in the buried semiconductor layer is widened laterally. In such a case, even if the STI structure is eroded to reach the buried semiconductor layer, the shorts between the source/drain regions and back gate region does not occur easily, which increases a yield of integrated circuit products.

BRIEF DESCRIPTION OF THE DRAWINGS

The foregoing and other objects, features and advantage of the present disclosure will become apparent from the following description of embodiments with reference to the accompanying drawings, in which.

DETAILED DESCRIPTION

Exemplary embodiments of the present disclosure will be described in more details below with reference to the accompanying drawings. However, it should be understood that the description of the embodiments of the present disclosure is illustrative, and is not intended to limit the scope of the disclosure. In addition, those depictions about well known structures and technology are omitted thereinafter, for the sake of avoiding unnecessary confusion to the conception of the present disclosure.

Structures of respective layers according to the embodiments of the present disclosure are schematically shown in the accompanying drawings. The drawings are provided only for explanation and not drawn to scale, in which some details are exaggerated, and some other details are probably omitted, for the sake of clarity. Shapes, relative sizes and relative positions of various regions and layers shown in the figures are only illustrative, and can be varied actually because of manufacturing tolerance or technical limitation. Those skilled in the present field may design other shapes, relative sizes and relative positions of the various regions/layers if necessary.

In the semiconductor structure and the method for manufacturing the same according to the embodiment of the present disclosure, the isolation structure embedded in the buried semiconductor layer is laterally extended such that both sides of the buried semiconductor layer are occupied by an isolating material. Therefore, even if the STI structure is eroded to the buried semiconductor layer in the manufacture process, the shorts between the source/drain contacts and the back gate region does not occur. Thus, the yield of SOI devices can be increased greatly.

Figure 2:
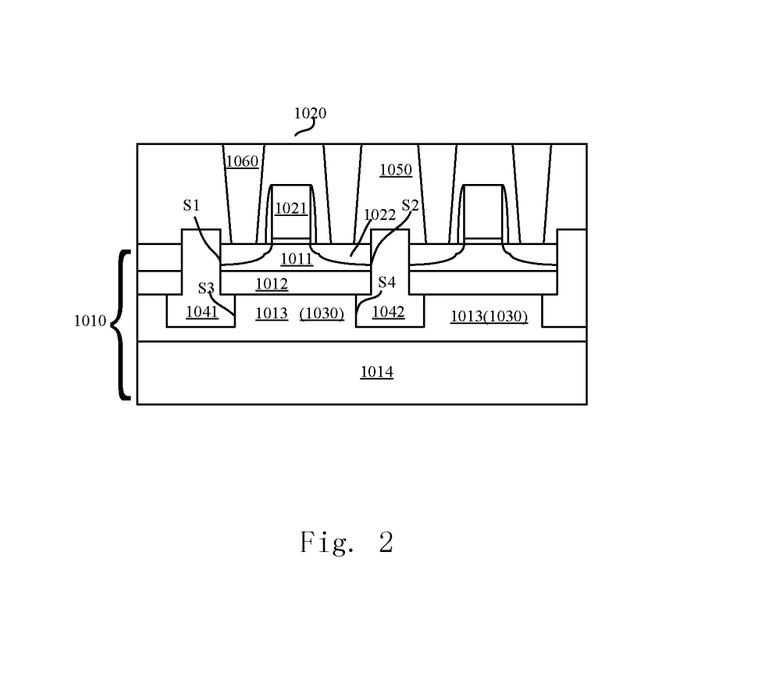
FIGS. 2 and 3 are cross-sectional views for illustrating a semiconductor structure according to embodiments of the present disclosure.

FIG. 2 shows a semiconductor structure according to one embodiment of the present disclosure. The semiconductor structure comprises an SOI substrate 1010, a MOSFET 1020, a back gate region 1030, a first isolation structure 1041 and a second isolation structure 1042.

The SOI substrate comprises an SOI layer 1011, a buried oxide layer 1012, a buried semiconductor layer 1013, and a semiconductor substrate 1014 from top to bottom. The MOSFET 1020 is formed on the SOI layer. The back gate region 1030 is an area formed by reducing resistance of the buried semiconductor layer 1013. The buried oxide layer 1012 can be replaced by other buried insulating layers.

The first isolation structure 1041 and the second isolation structure 1042 are located outside the MOSFET 1020 and are embedded in the SOI substrate 1010.

The first isolation structure 1041 and the second isolation structure 1042 laterally adjoin the SOI layer 1011 at the first side surface S1 and the second side surface S2, respectively. The first isolation structure 1041 laterally adjoins the buried semiconductor layer 1013 at the third side surface S3 which is located between the first side surface S1 and the second side surface S2.

According to the embodiments of the present disclosure, the semiconductor substrate 1014 may comprise any suitable semiconductor substrate materials. Specifically, the semiconductor substrate 1014 is made of, but not limit to, silicon, germanium, silicon germanium, SOI, silicon carbide, gallium arsenide, or any one of III-V compound semiconductor. According to design requirements (such as a p-type substrate or an N-type substrate) well known in the prior art, the substrate 1014 may comprise various doping regions. In addition, the substrate 1014 may comprise optional epitaxial layers which can be manipulated by stress to enhance performance. According to the embodiments of the present disclosure, the substrate 1014 may be made of bulk silicon; the buried semiconductor layer 1013 may be made of SiGe, polysilicon, amorphous silicon and so on; the buried oxide layer 1012 may be made of $SiO_2$; and the SOI layer 1011 may be made of Si, SiGe or polysilicon. The thickness of the SOI layer 1011 may be in the range of about 5-20 nm, the thickness of the buried oxide layer 1012 may be in the range of about 5-30 nm, and the thickness of the buried semiconductor layer 1013 may be in the range of about 10-100 nm.

The MOSFET 1020 comprises a gate stack 1021 and source/drain regions 1022. The gate stack 1021 is located on the SOI layer 1011, and the source/drain regions 1022 are located at both sides of the gate 1021 in the SOI layer 1011.

In an example, the back gate region 1030 may be doped with B for a pMOSFET, and the back gate region 1030 may be doped with P or As for an nMOSFET. The formation of the back gate region 1030 facilitates control of a channel region electric field under the control gate by the back gate voltage, and makes it possible to effectively suppress short channel effects. Meanwhile, the formation of the back gate region 1030 achieves the object of controlling the threshold voltage of devices.

In an example, the surface of the source/drain regions is higher than that of the SOI layer, and the raised source/drain regions facilitate reduction of contact resistance of source and drain.

In an example, the portions of both the first isolation structure 1041 and the second isolation structure 1042 embedded in the buried semiconductor layer 1013 have a width of about 80-200 nm, and the portions of both the first isolation structure 1041 and the second isolation structure 1042 over the buried semiconductor layer 1013 have a width of about 20-100 nm.

The embodiment of the present disclosure further comprises contact plugs 1060 formed in an interlayer dielectric 1050 and being in contact with the gate 1021 or the source/drain regions 1022.

In an example of the above technical solution, the first side surface S1, the second side surface S2 and the third side surface S3 can be substantially perpendicular to the plane where the SOI layer 1011 is located. The expression "substantially perpendicular to" means to be within acceptable tolerance of the technical process in the present technical field.

In an example of the above technical solution, the second isolation structure 1042 laterally adjoins the buried semiconductor layer 1013 at a fourth side surface S4 which is located between the second side surface S2 and third side surface S3. Moreover, the fourth side surface S4 is substantially perpendicular to the plane where the SOI layer 1011 is located. The meaning of the expression "substantially perpendicular to" is the same as what has been mentioned above.

Figure 3:
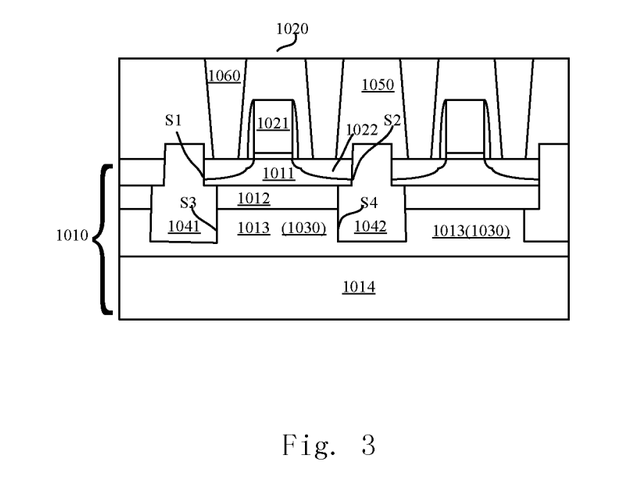

FIG. 3 shows a semiconductor structure according to another embodiment of the present disclosure, which is different from FIG. 2 in that the side where the first isolation structure 1041 laterally adjoins the buried oxide layer 1012 is an extension of the third side surface S3. Similarly, the side where the second isolation structure 1041 laterally adjoins the buried oxide layer 1012 is an extension of the fourth side surface S4. With such configuration, the present disclosure can also be achieved. Similarly, the present disclosure can be achieved, as long as the isolation structure extends laterally under the buried oxide layer 1012 and into both sides of the buried semiconductor layer 1013 so that the isolation structure is widened laterally, below an interface between the buried oxide layer 1012 and the buried semiconductor layer 1013.

Figure 4:
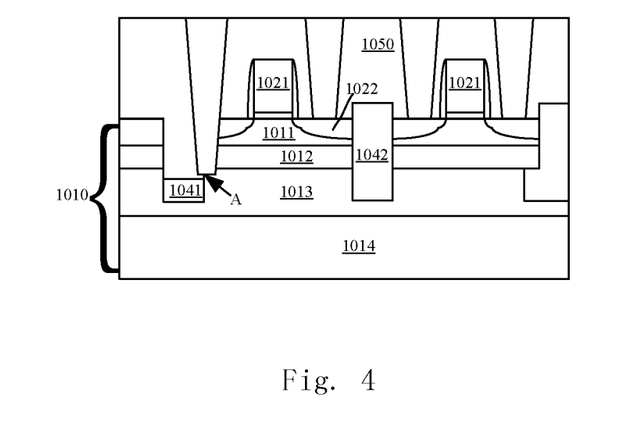
FIG. 4 is a cross-sectional view for illustrating shorts between the source/drain regions and the buried semiconductor layer in case of photolithography misalignment while forming contact holes in the prior art.
Figure 5:
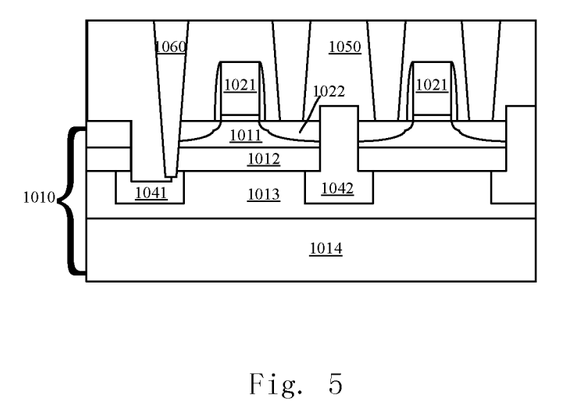
FIG. 5 is a cross-sectional view for illustrating a structure between the source/drain regions and the buried semiconductor layer in case of photolithography misalignment while forming contact holes according to the embodiments of the present disclosure.

In the semiconductor structure provided by the embodiments of the present disclosure, the STI structure extends laterally into the buried semiconductor layer 1013. The isolation structure embedded in the buried semiconductor layer is widened laterally, which may greatly reduce the possibility of shorts between the source/drain regions 1022 and the buried semiconductor layer 1013. In the formation of the STI structure of FIG. 4 according to the prior art, the STI structure is likely eroded to an undesired lower position (for example, the position where the buried semiconductor layer is located) in various steps of lithography, etching and erosion in processes such as gate etching and source/drain formation after forming the STI structure, which may cause shorts between source/drain contacts and the back gate region, as indicated by arrow A in FIG. 4. By means of the STI structure according to embodiments of the present disclosure, even if the STI structure is eroded to be a shape as shown in FIG. 5, the shorts between the source/drain contacts and the back gate region may not occur. Thus, the yield of SOI devices can be increased greatly.

A procedure of the method for manufacturing a semiconductor structure according to one embodiment of the present disclosure will be described in detail with reference to FIGS. 6-14.

Figure 6:
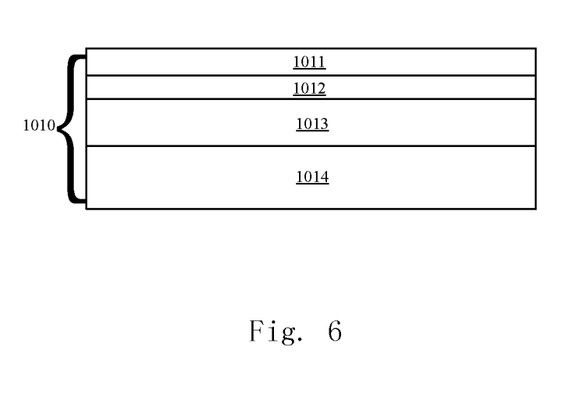
FIG. 6-14 are cross-sectional views for illustrating structures corresponding to various stages in the flow of manufacturing a semiconductor structure according to the embodiments of the present disclosure.

Firstly, as shown in FIG. 6, an SOI substrate 1010 is provided, comprising an SOI layer 1011, a buried oxide layer 1012, a buried semiconductor layer 1013, and a substrate 1014 from top to bottom.

The SOI layer 1011 may be formed by any method known in the art. For example, the SmartCut™ process (referred as "Smart Cut" or "Smart Strip") can be used for this purpose. The SmartCut™ process comprises bonding two substrates with each other, wherein each of the substrates has a surface oxide layer formed by thermal oxidation or deposition, and one of the substrates is subjected to hydrogen implantation so as to form a hydrogen implantation region at a predetermined depth in the silicon body below the surface oxide layer, so that the hydrogen implantation region may be converted into a layer having micro-cavities under the conditions of an increased pressure and an increased temperature so as to separate layers, and wherein the other one of the two substrates serves as an SOI substrate. By controlling process parameters of the thermal oxidation or deposition, the thickness of the buried oxide layer in the SOI substrate can be varied. By controlling implantation energy during the hydrogen implantation, the thickness of the top semiconductor layer in the SOI substrate can be varied.

The buried oxide layer 1012 can be replaced with other buried insulating layers.

The substrate 1014 may comprise any suitable semiconductor substrate materials. Specifically, the semiconductor substrate 1014 may be made of, but not limit to, silicon, germanium, silicon germanium, SOI, silicon carbide, gallium arsenide, or any one of III-V compound semiconductor. According to design requirements (such as a p-type substrate or an N-type substrate) well known in the prior art, the substrate 1014 may comprise various doping regions. In addition, the substrate 1014 may comprise optional epitaxial layers which can be manipulated by stress to enhance performance. According to the embodiment of the present disclosure, the substrate 1014 may be made of bulk silicon; the buried semiconductor layer 1013 may be made of SiGe, polysilicon, amorphous silicon and so on; the buried oxide layer 1012 may be made of $SiO_2$; and the SOI layer 1011 may be made of Si, SiGe or polysilicon.

The thickness of the SOI layer 1011 may be in the range of about 5-20 nm, the thickness of the buried oxide layer 1012 may be in the range of about 5-30 nm, and the thickness of the buried semiconductor layer 1013 may be in the range of about 10-100 nm.

Figure 7:
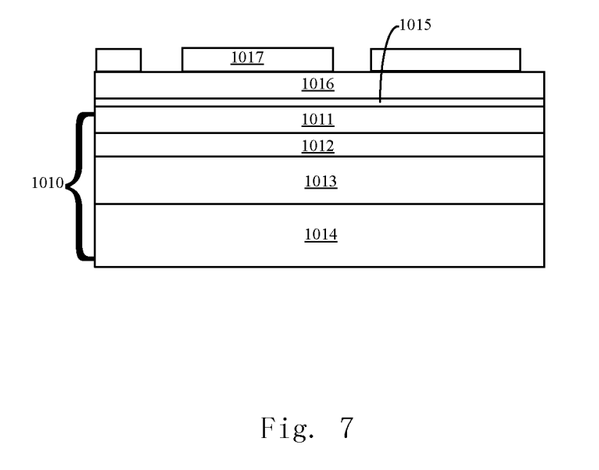

As shown in FIG. 7, an oxide liner 1015 and a nitride liner 1016 are formed, and a photoresist layer 1017 is coated on the nitride liner 1016. The photoresist layer 1017 is patterned according to the size of the top of the STI trench as required, so as to form a patterned photoresist pattern.

Figure 8:
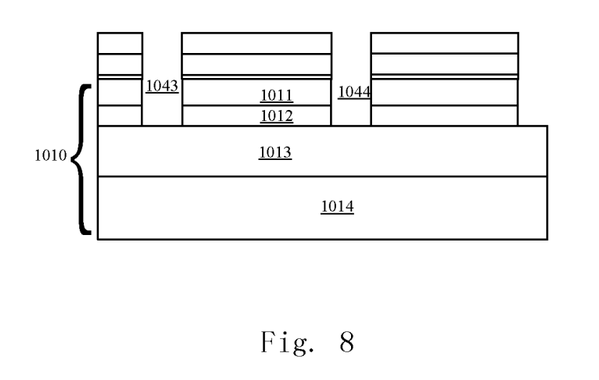

Next, as shown in FIG. 8, a first preliminary trench 1043 and a second preliminary trench 1044 are formed on the SOI substrate to be embedded into the SOI substrate. The first preliminary trench 1043 and the second preliminary trench 1044 may both have a depth to reach the top of the buried semiconductor layer 1013. Conventional anisotropic etching can be used in this etching step, such as reactive ion etching and so on. Specifically, with the photoresist pattern 1017 as a mask, the SOI substrate 1010 is etched to form the first preliminary trench 1043 and the second preliminary trench 1044. The first preliminary trench 1043 and the second preliminary trench 1044 each have substantially identical width at the top and at the bottom.

Figure 9:
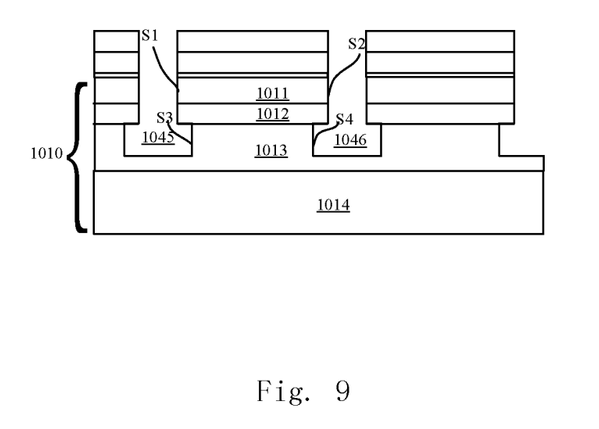

Furthermore, the first preliminary trench 1043 and the second preliminary trench 1044 are etched by lateral etching, isotropic dry or wet etching to form the first isolation trench 1045 and the second isolation trench 1046, as shown in FIG. 9. The portion of each of the first isolation trench 1045 and the second isolation trench 1046 embedded in the buried semiconductor layer 1013 laterally extends into the buried semiconductor layer. Next, the photoresist pattern 1017 is removed.

In an example, the portion of each of the first isolation trench 1045 and the second isolation trench 1046 embedded in the buried semiconductor layer 1013 may have a width about 80-200 nm, and the portion of each of the first isolation trench 1045 and the second isolation trench 1046 over the buried semiconductor layer may have a width of about 20-100 nm.

Figure 10:
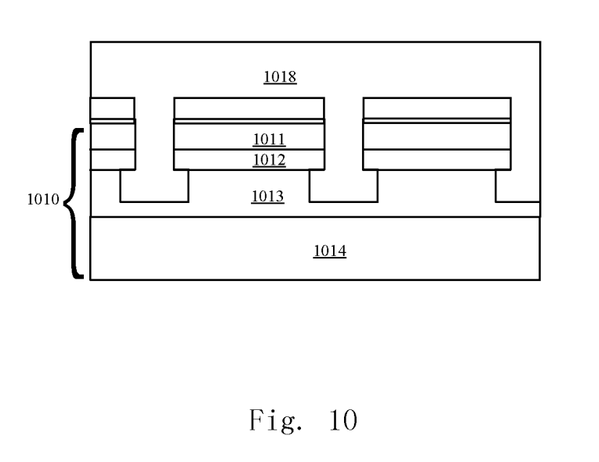
Figure 11:
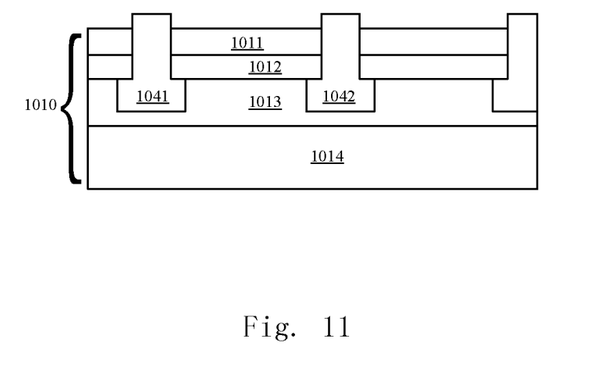

Next, an isolation dielectric such as silicon oxide and the like is filled into the first isolation trench 1045 and the second isolation trench 1046, so as to form shallow trench isolation structures. Specifically, as shown in FIG. 10, a dielectric layer 1018 is formed on the whole semiconductor structure and planarized to the nitride liner 1016. Then the nitride liner 1016 is etched back to the oxide liner 1015. Finally, the oxide liner 1015 is removed to form the first isolation structure 1041 and the second isolation structure 1042, as shown in FIG. 11.

After further etching to form a first isolation trench 1045 and a second isolation trench 1046, the first isolation trench 1045 laterally adjoin the SOI layer 1011 at a first side surface S1, the second isolation trench 1046 laterally adjoin the SOI layer 1011 at a second side surface S2, the first isolation trench 1045 laterally adjoin the buried semiconductor layer 1013 at a third side surface S3, and the second isolation trench 1046 laterally adjoin the buried semiconductor layer 1013 at a fourth side surface S4.

The third side surface S3 is located between the first side surface S1 and the second side surface S2.

In an example of the above technical solution, the first side surface S1, the second side surface S2, the third side surface S3 and the fourth side surface can be substantially perpendicular to the plane where the SOI layer 1011 is located. The expression "substantially perpendicular to" means to be within acceptable tolerance of the technical process in the present technical field. For example, the expression "substantially perpendicular to" may refer to an effect which can be achieved by lateral etching, and isotropic dry or wet etching.

In an example, the fourth side surface S4 is located between the second side surface S2 and the third side surface S3.

The above steps provide a trench having a shape conformal with the first isolation structure and the second isolation structure shown in FIG. 2.

Alternatively, in order to provide a trench having a shape conformal with the first isolation structure and the second isolation structure shown in FIG. 3, the etching depth is relatively small when forming the first preliminary trench 1041 and the second preliminary trench 1042 in the step shown in FIG. 8. For example, the first preliminary trench 1043 and the second preliminary trench 1044 each may have a etching depth to reach just the top of the buried oxide layer 1012. Lateral etching or isotropic etching is then performed in the step shown in FIG. 9 so that the third side surface S3 extends to form the side surface where the first isolation trench 1045 laterally adjoins the buried oxide layer 1012. Similarly, the fourth side surface S4 extends to form the side surface where the second isolation trench 1046 laterally adjoins the buried oxide layer 1012. The object of the embodiments of the present disclosure may be achieved, as long as the further lateral etching or isotropic etching is performed so that the isolation trenches extend laterally under the interface between the buried oxide layer 1012 and the buried semiconductor layer, and are in contact with the buried semiconductor layer 1013 at side surfaces close to the centers of the devices to be formed.

Thus, in a case where a first isolation trench 1045 and a second isolation trench 1046 are formed, the interfaces between side surfaces of both the first isolation structure 1041 and the second isolation structure 1042, which are formed by filling with a dielectric layer, with both the SOI layer 1011 and the buried semiconductor layer 1012, will be the case of the first isolation trench 1045 and the second isolation trench 1046. Therefore, it provides the isolation structure extending laterally into the buried semiconductor layer and contacting the buried semiconductor layer 1013 at side surfaces close to the center of the device to be formed.

Figure 12:
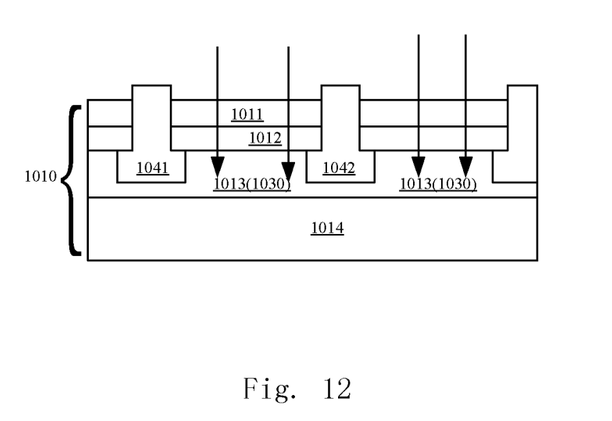

As shown in FIG. 12, a back gate region 1030 is formed by doping the buried semiconductor layer 1013 with ions such as As or P for an nMOSFET, and with ions such as B for a pMOSFET. The doping concentration may be in a range of about $10^{18} \sim 10^{21}$ cm$^{-3}$. The back gate region 1030 formed by resistance reduction can facilitate control of an electric field in the channel region under a control gate, by applying a back gate voltage. Thus, it is possible to effectively suppress short channel effects, and achieve the object of controlling the threshold voltage of devices.

The back gate region 1030 may also be formed before the formation of STI. Moreover, since the buried semiconductor layer 1013 is doped, the etching rate during etching of the STI trench can be controlled.

Figure 13:
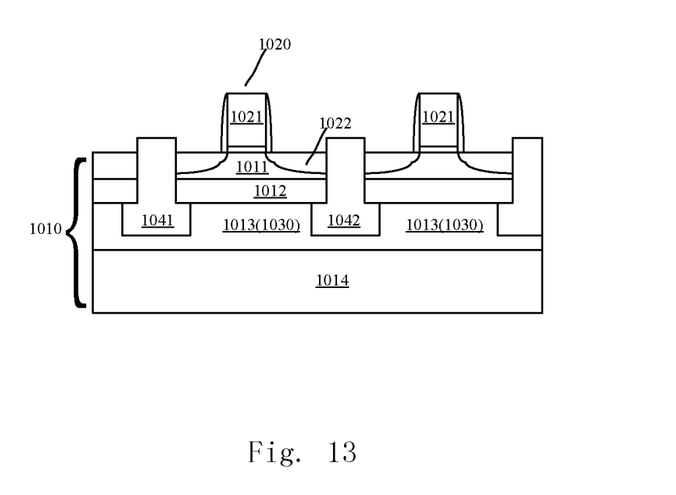

As shown in FIG. 13, other portions of the MOSFET 1020 are formed on the SOI substrate, such as a gate 1021 and source/drain regions 1022 at both sides of the gate. The source/drain regions 1022 can be formed by performing ion implantation in the SOI layer 1011 at both sides of the gate, for example, with ions such as B for a pMOSFET, and with ions such as As or P for an nMOSFET. Optionally, raised source/drain regions can be further formed (not shown in the drawings), so as to further reduce contact resistance of the source/drain regions. Furthermore, metal silicide contacts (not shown in the drawings) can be further formed on the source/drain regions 1022 and the gate 1021.

Figure 14:
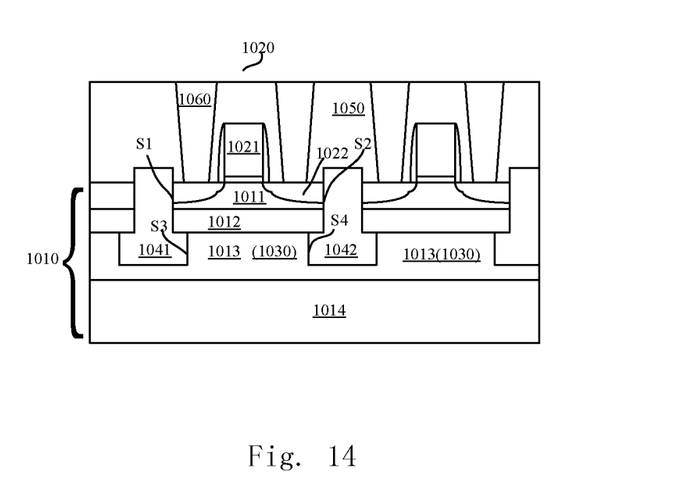

As shown in FIG. 14, a dielectric layer 1050 and contact plugs 1060 may be further formed.

In the manufacturing method of a semiconductor structure provided by the embodiments of the present disclosure, the STI structure extends laterally into the buried semiconductor layer 1013 by further etching the STI trench. That is, the dielectric material of the STI structure extends laterally into both sides of the buried semiconductor layer 1012, which may greatly reduce the possibility of shorts between the source/drain regions 1022 and buried semiconductor layer 1013. Utilizing the STI structure according to embodiments of the present disclosure, the shorts between the source/drain contacts and the back gate region may not occur even if the STI structure is eroded to be in a shape as shown in FIG. 5. Thus, the yield of SOI devices can be increased greatly.

In the above description, the technical details such as patterning and etching of each layer are not explained. However, it can be understood by those skilled in the art that various means known in the prior art can be used to form the layers and regions having desired shapes. Moreover, those skilled in the art can envisage methods which are different from what has been mentioned above to form the same structure.

Although the disclosure has been described with reference to specific embodiments, the description is only illustrative of the disclosure. The description is not construed as limiting the disclosure. The scope of the present disclosure is defined by the appended claims and equivalents thereof. Various modifications and applications may occur for those skilled in the art without departing from the true spirit and scope of the disclosure.

We claim:

1. A semiconductor structure formed on an SOI substrate comprising
 a semiconductor (SOI) layer,
 a buried insulating layer,
 a buried semiconductor layer and
 a semiconductor substrate in a stack, said semiconductor structure comprising:
 source/drain regions formed in the SOI layer;
 a gate formed on the SOI layer, wherein the source/drain regions are located at both sides of the gate;
 a back gate region formed by a portion of the buried semiconductor layer; and
 a first isolation structure and a second isolation structure which are located at both sides of the source/drain regions and extend into the SOI substrate;
 wherein:
 the first isolation structure and the second isolation structure laterally adjoin the SOI layer at a first side surface and a second side surface, respectively;
 the first isolation structure laterally adjoins the buried semiconductor layer at a third side surface; and the third side surface is located between the first side surface and the second side surface.

2. The semiconductor structure according to claim 1, wherein the first side surface, the second side surface and the third side surface are substantially perpendicular to the plane where the SOI layer is located.

3. The semiconductor structure according to claim 1, wherein the second isolation structure laterally adjoins the buried semiconductor layer at a fourth side surface, the fourth side surface is located between the first side surface and the second side surface and is opposite to the third side surface, and the fourth side surface is substantially perpendicular to the plane where the SOI layer is located.

4. The semiconductor structure according to claim 1, wherein the buried semiconductor layer is made of crystalline SiGe or crystalline Si.

5. The semiconductor structure according to claim 1, wherein the back gate region is doped with B for a pMOSFET, and the back gate region is doped with P or As for an nMOSFET.

6. The semiconductor structure according to claim 1, wherein the SOI layer has a thickness of about 5-20 nm, the buried insulating layer has a thickness of about 5-30 nm, and the buried semiconductor layer has a thickness of about 10-100 nm.

7. The semiconductor structure according to claim 1, wherein a portion of each of the first isolation structure and the second isolation structure in the buried semiconductor layer has a width of about 80-200 nm, and a portion of each of the first isolation structure and the second isolation structure over the buried semiconductor layer has a width of about 20-100 nm.

8. The semiconductor structure according to claim 1, wherein the buried insulating layer is a buried oxide layer.

* * * * *